June 22, 1965 R. W. AHRONS 3,191,063

CRYOELECTRIC CIRCUITS

Filed Aug. 8, 1962 2 Sheets-Sheet 1

INVENTOR.
RICHARD W. AHRONS
BY
Samuel Cohen
ATTORNEY

June 22, 1965 R. W. AHRONS 3,191,063

CRYOELECTRIC CIRCUITS

Filed Aug. 8, 1962 2 Sheets-Sheet 2

INVENTOR.
RICHARD W. AHRONS
BY
ATTORNEY

United States Patent Office 3,191,063
Patented June 22, 1965

3,191,063
CRYOELECTRIC CIRCUITS
Richard W. Ahrons, Somerville, N.J., assignor, by mesne assignments, to the United States of America as represented by the Secretary of the Air Force
Filed Aug. 8, 1962, Ser. No. 215,557
1 Claim. (Cl. 307—88.5)

This invention relates to cryoelectric circuits.

An object of the invention is to provide a cryoelectric, electronically controllable inductor.

Another object of the invention is to provide a high speed inductive switch which is suitable, for example, for use in a cryoelectric selection tree.

A cryoelectric circuit has been suggested which includes a first superconductor element closely adjacent to a superconductor control element. A signal applied to the control element switches the same between superconducting and non-superconducting (normal or intermediate) states and in this way, greatly changes the inductance of the first element. A number of circuits of this type may be interconnected to form a plurality of current paths extending between an input terminal and a plurality of output terminals. The inductance of the various paths may then be selectively changed in a manner to make all except a desired path (or paths) have a relatively high inductance. In this condition, a current applied to the input terminal steers into a desired path (or paths) in view of its (or their) lower inductance.

In the improved circuit of the present invention, an element having a (magnetic) permeability $\mu$ substantially greater than 1 is placed on the side of the superconductor control element opposite the first superconductor element mentioned above. When the superconductor control element is in its superconducting state, the first superconductor element has a relatively low inductance as in the case of the known circuits described above. However, when the superconductor control element is switched to its non-superconducting (normal or intermediate) state, the inductance of the first element now increases to a value well beyond that of the previous circuit. The great increase in inductance is due to the high permeability material in the close vicinity of the first superconductor element which material is no longer shielded from the first superconductor element by the superconductor control element.

The invention is described in greater detail below and is illustrated in the following drawings in which.

In the discussion of the operation of the circuits illustrated, it is assumed that they are maintained at a low temperature, such as a few degrees Kelvin, at which superconductivity is possible.

Figure 1:
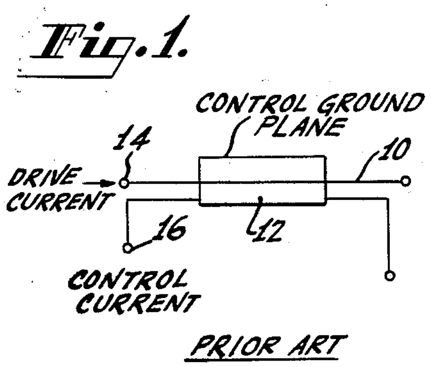
FIGURE 1 is a schematic drawing of the prior cryoelectric electronically controllable circuit described above.

The circuit of FIG. 1 is known as a cryotron. The circuit includes a first superconductor element 10 closely adjacent to but insulated from a second superconductor element 12 known as a control ground plane. A signal or drive current is applied to input terminal 14 and a control current may be applied to the input terminal 16. In the absence of the control current applied to terminal 16, the control ground plane 12 is in its superconducting state and acts as a magnetic field shield. Under these conditions, the inductance of lead 10 is relatively low. However, when a control current having an amplitude greater than the "critical current" for control ground plane 12 is applied to terminal 16, the control ground plane is driven to its normal state and the inductance of lead 10 increases greatly.

An important use of the circuit of FIGURE 1 is in a selection tree such as a cryoelectric pyramid selection tree. Such a tree has a number of branches and each has associated therewith a control ground plane such as 12. If all of the planes except the one or ones associated with one current path through the tree are driven out of the superconducting state, an input current pulse applied to the tree will flow mainly through that one path in view of its relatively low inductance compared to the other paths.

It is possible to operate the circuit of FIG. 1 by switching the control ground plane into its normal state or its intermediate state. The latter may be accomplished by placing a resistor of relatively low value such as $10^{-3}$–$10^4$ ohms across the control ground plane.

The inductance of a superconductor element can be determined by complex equations discussed generally in N. H. Meyers, "Inductance in Thin-Film Superconducting Structures," Proceedings of the IRE, vol. 49, page 1640, November 1961. While unnecessary to discuss these equations here, the article indicates that the inductance is, among other things, a function of $\mu_0$, the permeability of free space. See, for example, equation 15. The term $\mu_0$ is employed by Meyers as the circuits he discusses are assumed to be in free space. It can be shown that if, instead of a free space environment, a circuit is located close to an element having a $\mu$ which is greater than $\mu_0$, its inductance increases. Use is made of this fact in the circuits of the present invention.

Figure 2:
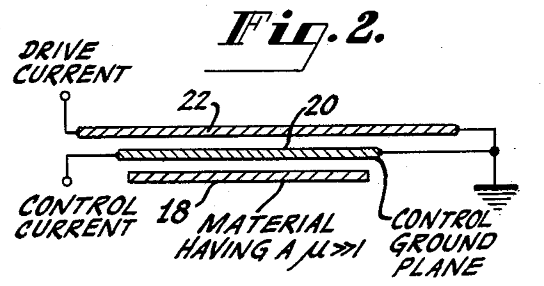
FIGURE 2 is a schematic drawing of an improved circuit according to the present invention.

In the circuit of FIG. 2, an element 18 formed of a material having a $\mu$ which is greater than 1, is placed on the side of the control ground plane 20 opposite from the drive current carrying lead 22. The material 18 may be a ferromagnetic material such as iron, permalloy, one of the many ferrites or the like. A linear material is preferred; i.e. one having no, or substantially no, hysteresis. Many of the ferrite and permalloy materials which exhibit square hysteresis loops at room temperature have much less hysteresis in the low temperature environment at which the circuits of the present invention are operated, and are therefore suitable.

Figure 3:
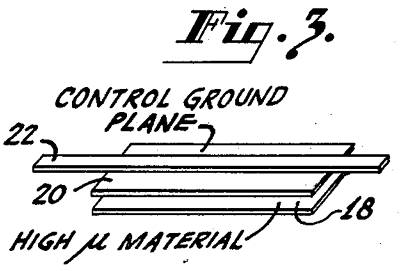
FIGURE 3 is a perspective view of the improved circuit of the present invention.

A perspective view of the circuit of FIG. 2 is shown in FIGURE 3. In FIG. 3 the drive current carrying conductor 22 is shown in the form of a strip line.

It is to be understood that both in the circuits of FIGS. 2 and 3, the elements 18, 20 and 22 may all be in the form of thin films or sheets. The films may be formed by vacuum deposition or other known techniques. The films are spaced from one another by a thin film of insulating material such as silicon monoxide or the like. This material is not shown in order to simplify the drawing.

In the operation of the circuit of FIG. 2, when the control ground plane 20 is in its superconducting condition, a drive current applied to the conductor 22 "sees" a relatively low value of inductance (one not greatly different than that of the prior art cryotron of FIG. 1). However, when the control ground plane 20 is placed in its normal condition by an input control current, the inductance seen by a drive current applied to the conductor 22 is much, much greater. The inclusion of element 18 greatly increases the inductance seen by the drive current applied to element 22 over what it would be in the absence of element 18. This increase in inductance over that obtained with the previous circuit may be 2 to 5 orders of magnitude (depending on the material of which element 18 is made and its thickness). The increase in inductance over that obtained with the previous circuit can be considered an increase in gain. To illustrate, when employed in a selection tree the ratio of inductances between a selected path and the unselected paths is greatly increased and this steers more of the drive current into the selected path.

Figure 6:
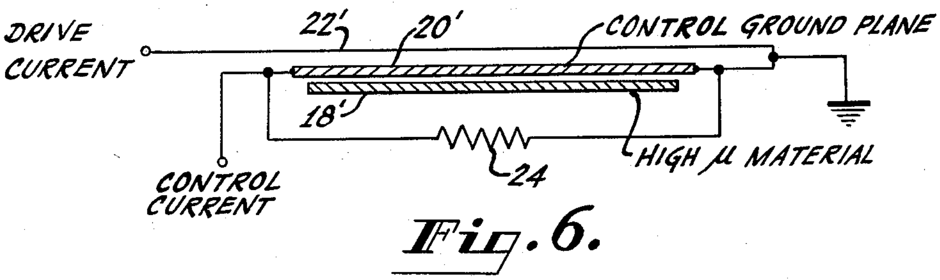
FIGURE 6 is a schematic representation of another embodiment of the present invention.

In the arrangement of FIGS. 2 and 3, the control ground plane is driven between superconducting and normal (non-superconducting) states. In the circuit of FIGURE 6, a biasing resistor 24 of relatively low value is placed across the control ground plane 20'. This biasing circuit causes the control ground plane to be switched between superconducting and intermediate states rather than between superconducting and normal states. An important advantage of this mode of operation is that less power is consumed in driving the ground plane out of the superconducting state.

Figure 4:
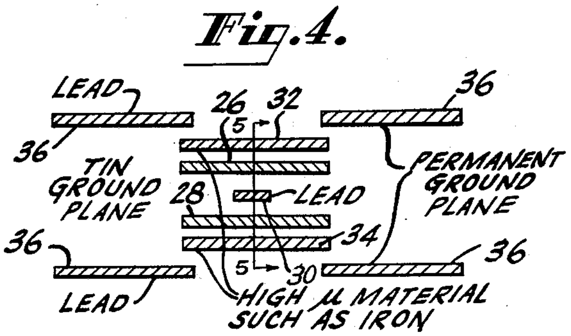
FIGURE 4 is a cross-sectional view of another form of the present invention.
Figure 5:
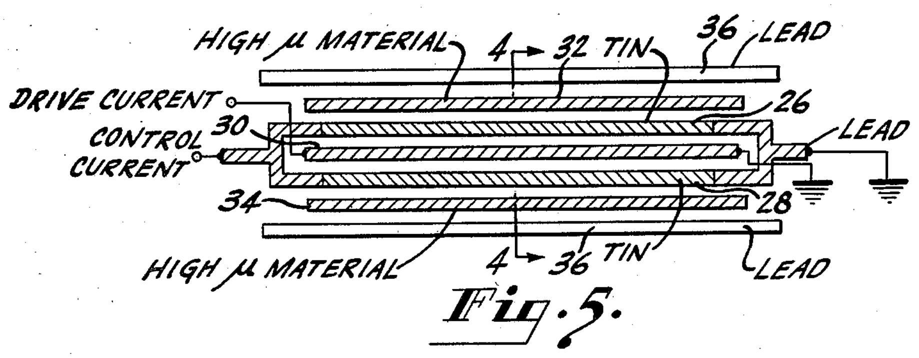
FIGURE 5 is a cross-sectional view taken along line 5—5 of FIGURE 4.

Another structure according to the present invention is shown in FIGS. 4 and 5. In this arrangement, the control ground planes 26 and 28 are located one on each side of the drive current carrying lead 30. There are also two elements 32 and 34, respectively, having a high permeability, one located beyond each control ground plane. Finally, there are permanent ground planes 36 located beyond the control ground planes in the positions shown, serving to shield the cryotron.

The operation of the arrangement of FIGS. 4 and 5 is similar to that of the other embodiments already discussed. As in the other embodiments, insulation is not shown. Also, as in the other embodiments, in a preferred form of the invention, resistors are placed in shunt across the ground planes.

Figure 7:
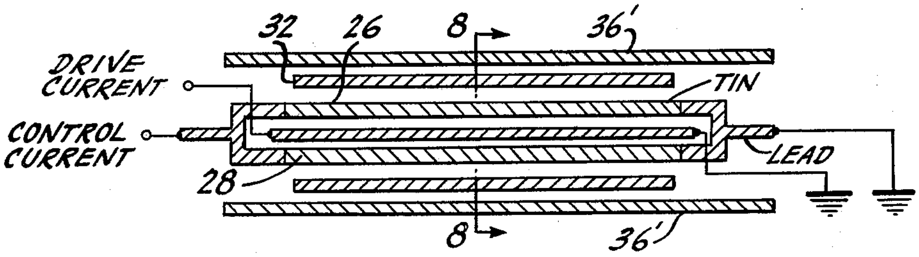
FIGURES 7 and 8 are cross-sectional views of another embodiment of the invention.
Figure 8:
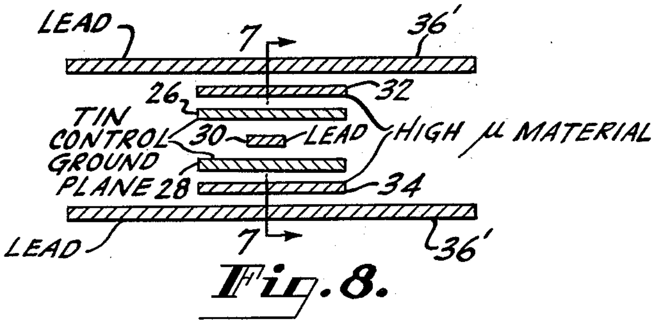

The modified form of the invention shown in FIGS. 7 and 8 is similar to the embodiment of FIGS. 4 and 5. The only difference is in the permanent ground plane 36', made of lead which, in the case of the embodiment of FIGS. 7 and 8, is made in a single layer and essentially completely shields the cryotron. Even though the cryotron is shielded by superconductors 26 and 28, the presence of the high permeability elements 32 and 34 between the permanent ground plane and the drive current carrying element 30 still causes the inductance of element 30 to greatly increase when the control ground planes 26 and 28 are driven out of their superconducting state. While not shown in FIGS. 7 and 8, it is to be understood that both here and in all other embodiments, resistors may be placed in shunt with the control ground planes to permit their operation in the intermediate state.

While not illustrated, it is to be understood that improved cryotrons disclosed herein, may be arranged in the form of selection trees such as discussed above. It is also to be understood that means other than current may be employed to drive the control ground plane out of the superconducting state. For example, radiant energy such as infrared radiation, microwaves, sound ultraviolet light, high energy particles and so on may be used. Alternatively, temperature rather than current may be employed. The control means, in this case, may be in the form of a heating element adjacent to the control ground plane.

What is claimed is:

In combination:

a first superconductor current carrying element;

two superconductor control ground planes arranged adjacent to the first superconductor element, one on each side of said current carrying element;

permanent ground planes which are insulated from the control ground plane and slightly overlap and extend beyond the edges of the control ground planes, said control ground planes and permanent ground planes providing a shield for said first superconductor element;

terminals coupled to said control ground planes to which current may be applied for driving the control ground planes, in unison, between superconducting and non-superconducting states;

and two additional planes each having a permeability substantially greater than 1, one located between one control ground plane and its permanent ground plane and the other located between the second superconductor control ground plane and its permanent ground plane, said two additional planes having a permeability substantially greater than 1 arranged so that they are shielded from the first superconductor current carrying element when the two superconductor control ground planes are in their superconducting state.

References Cited by the Examiner

UNITED STATES PATENTS

| | | | |
|---|---|---|---|
| 2,944,211 | 7/60 | Richards | 307—88.5 |
| 3,093,754 | 6/63 | Mann | 307—88.5 |
| 3,094,628 | 6/63 | Jiu | 307—88.5 |
| 3,106,648 | 10/63 | McMahon et al. | 307—88.5 |
| 3,116,422 | 12/63 | May et al. | 307—88.5 |

ARTHUR GAUSS, *Primary Examiner.*

JAMES D. KALLAM, *Examiner.*